United States Patent [19]
Teng

[11] Patent Number: 5,736,458
[45] Date of Patent: Apr. 7, 1998

[54] METHOD FOR IMPROVED ALUMINIUM-COPPER DEPOSITION AND ROBUST VIA CONTACT RESISTANCE

[75] Inventor: Ming-Chang Teng, Hsin-Chu, Taiwan

[73] Assignee: Taiwan Semiconductor Manufacturing Company, Ltd., Hsin-Chu, Taiwan

[21] Appl. No.: 839,416

[22] Filed: Apr. 14, 1997

Related U.S. Application Data

[63] Continuation of Ser. No. 595,704, Feb. 2, 1996, abandoned.

[51] Int. Cl.⁶ .................................................. H01L 21/283
[52] U.S. Cl. ........................ 438/627; 438/643; 438/648
[58] Field of Search ................................. 437/190, 192, 437/194, 195, 198, 228 ST; 257/751, 763; 438/627, 643, 648, 688

[56] References Cited

U.S. PATENT DOCUMENTS

| | | | |
|---|---|---|---|
| 4,782,380 | 11/1988 | Shankar et al. | 438/643 |
| 5,175,126 | 12/1992 | Ho et al. | 438/643 |
| 5,236,869 | 8/1993 | Takagi et al. | 438/643 |
| 5,312,775 | 5/1994 | Fujii et al. | 437/192 |
| 5,412,250 | 5/1995 | Brugge | 257/750 |
| 5,427,666 | 6/1995 | Mueller et al. | 204/192.17 |
| 5,502,004 | 3/1996 | Park | 438/643 |
| 5,604,155 | 2/1997 | Wang | 438/627 |

OTHER PUBLICATIONS

S. Wolf. "Silicon Processing for the VLSI Era" vol. 2, Lattice Press, Sunset Beach, CA 1990, p. 263.

*Primary Examiner*—T. N. Quach
*Attorney, Agent, or Firm*—George O. Saile; Stephen B. Ackerman

[57] ABSTRACT

A method for improving the electrical resistance of contacting surfaces in via holes in semiconductor substrates is disclosed. The via holes are formed and later filled with metal to interconnect metal layers in the substrate. The method involves the introduction of a post-treatment process in the filling of vias with metal. Specifically, the nitrogen treatment step followed by a vacuum break is introduced right after the deposition of a titanium layer over the exposed first upper metal layer when the via holes are first opened. The treatment is accomplished in situ, that is, without breaking vacuum, and at room temperature. The remaining steps of filling the vias follow the conventional methods. It is shown that the contact resistances are reduced and that a further reduction in the contact resistance is achieved if the nitrogen treatment is performed along with vacuum break.

13 Claims, 4 Drawing Sheets

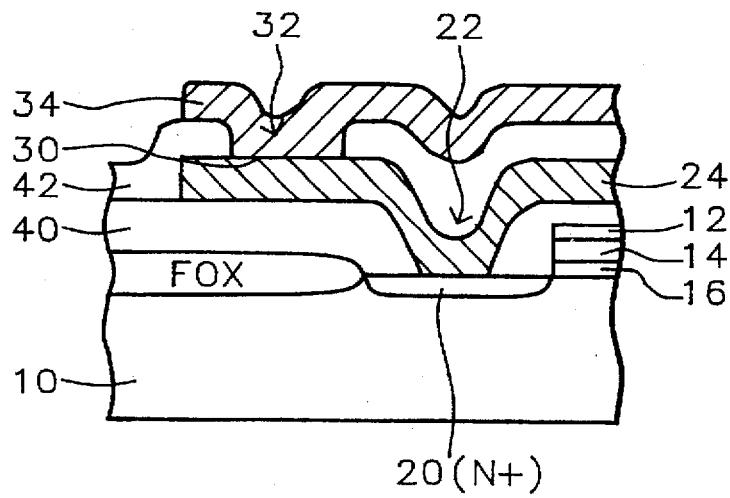
FIG. 1 - Prior Art
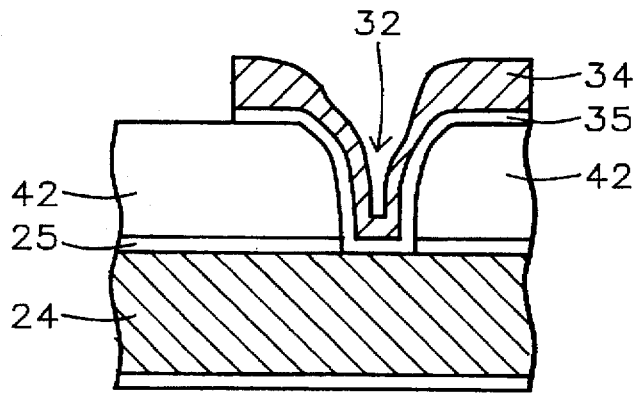
FIG. 2 - Prior Art
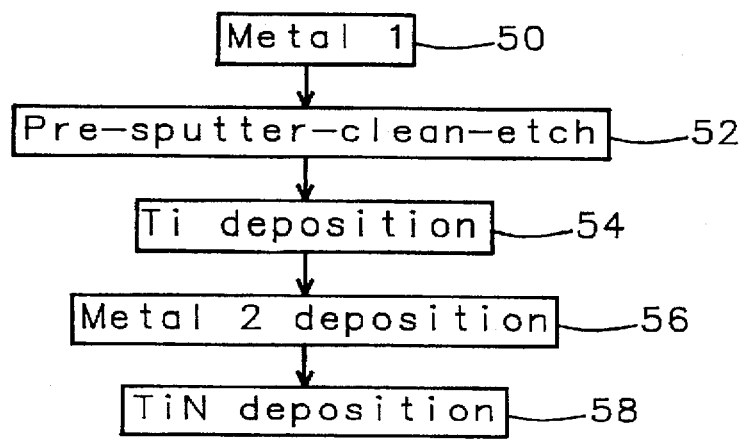
FIG. 3 - Prior Art

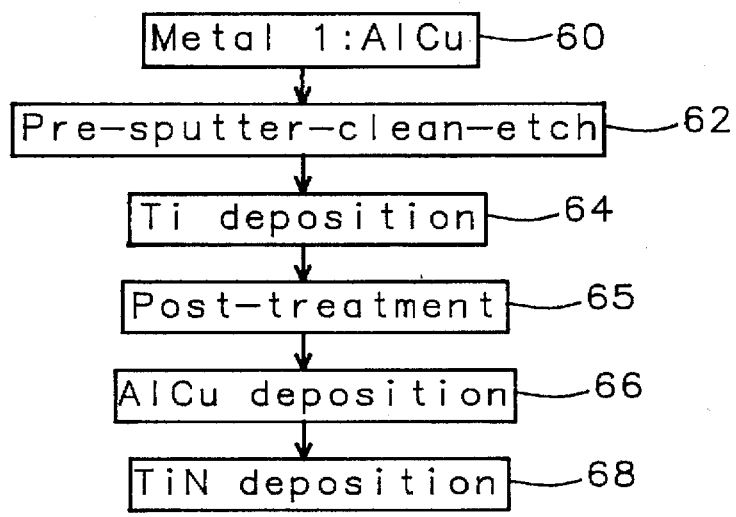
FIG. 4
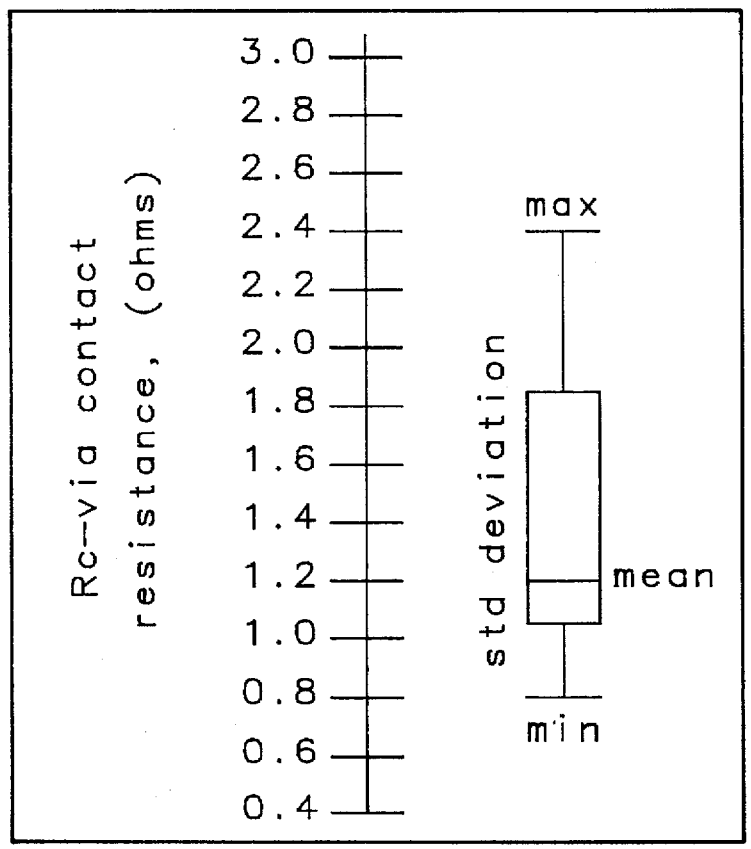
FIG. 5A – Prior Art

METHOD FOR IMPROVED ALUMINIUM-COPPER DEPOSITION AND ROBUST VIA CONTACT RESISTANCE

This patent application is a continuation of prior application Ser. No. 08/595,704 filed on 02 Feb. 1996 assigned to common assignee abandoned.

BACKGROUND OF THE INVENTION

(1) Field of the Invention

The present invention relates generally to semiconductors, and in particular, to substantially improving the contact resistance of vias by incorporating a specific treatment step in the deposition of interconnects.

(2) Description of the Related Art

The performance of semiconductor integrated circuit chips is governed, in general, by the electrical characteristics of circuit components, and in particular, by the electrical impedance of the same. The components consist of electronic devices themselves where transistor actions occur, and the circuitry that connect the various components together. In the metal-oxide-semiconductors (MOS), the devices include the gate-source-drain, while in bipolars, the base-emitter-collector. The rest of the circuitry, namely, the micro-wires or the lines that connect the devices through various layers of the semiconductor are, for the most part, similar functionally and physically in both the MOS and bipolar technologies. Furthermore, the unit electrical resistance of the metal lines, or interconnects, are usually insignificant in comparison with the electrical resistance that is encountered at places where the lines make physical connection with each other or with the devices mentioned above. If the connection is to be made between components at different elevations, or levels, that are electrically insulated from each other within a semiconductor, then holes are formed in the insulators so that connections can be made through metal deposited into holes between the levels. Holes that reach over the devices that are normally at the lowest level are referred to as the "contact" holes. If, on the other hand, the holes are between the upper levels of the circuitry, those holes are referred to as the "via" holes. The metal that fills these holes are called the "contact-plug," and the "via-plug", respectively. It is the contact resistance that is offered to current flow at the interfaces between the "plugs" and the mating metal surfaces that governs, to a large extent, the performance of semiconductor integrated circuits.

The process of building the aforementioned devices starts first by forming regions of field isolation in a silicon substrate. Then, in the MOS process, for example, a conductive gate is formed over a dielectric. The source and drain regions are heavily doped. Interlevel dielectric layers are deposited over these areas to serve as electrical insulators. Subsequently, holes are opened (e.g., etched) in the interlevel dielectric whereby metal deposited later into these holes form "contact-plugs" which contact the source, drain and gate regions. Depending upon the levels of integration of the integrated circuit chip, one or more metal layers with appropriate circuitized patterns are next deposited alternately with interlevel dielectric layers, which are usually planarized oxides. Connections between the metal layers is provided through "via-plugs." In the highly dense, submicron integrated circuit devices, where small feature sizes are desired, 3 or 4 levels of interconnection metallization may be required.

The interconnections so formed through the "contact-plugs" or the "via-plugs" exhibit resistance (or impedance in the general case) to the flow of electric current through them. The nature of this electrical behavior can significantly impact the circuit performance of integrated circuits. Usually, the electrical resistance of the solid metal plugs themselves is small in comparison with the interfacial resistance that exists between the plugs and the contact surface that they are deposited on. When the contact surface is the silicon (Si) substrate, the interfacial or the contact resistance, $R_{cs}$, becomes a part of a parasitic resistance, $R_p$, that exists in the path between the metal plug-to-Si substrate interface and the region in the device where the actual transistor action begins. The various other resistances within the devices themselves that contribute to the total $R_p$ are well known and as they are not significant to the invention, will not be described in detail here. It is also known that the contribution of the contact resistance $R_{cs}$ of the metal-Si interface can be significant and that many methods have been devised to reduce its contribution to the over-all resistance, $R_p$. It is of interest to note that a similar contact resistance, $R_{cm}$, but at a metal-to-metal interface, exists with the "via-plugs" that connect the upper level metals in the upper interconnect layers. While many methods are available for improving the integrity of the metal-Si contact interface, as noted above, few exist for metal-metal interfaces in the via-plugs, which is the main concern of the present invention. It is, therefore, well to review briefly the former methods before disclosing the methods of this invention. (It should be noted that in what follows, metal over vias will be referred to as "upper metal" to distinguish from metal over lower contact holes).

The integrity and characteristics of a metal-to-silicon contact is determined by the processes and the materials used in forming the contact. One of the important steps in the basic process of forming contact to silicon is the preparation of the silicon surface prior to the deposition of metal into the contact hole. This step involves general cleaning and the removal of any oxide layers. As will be seen in this invention, in addition to cleaning, a special treatment of the metal surface is disclosed for the preparation of the metal-to-metal contact areas in the via holes. As for the materials, aluminum (Al) and aluminum alloys are still the most common interconnect metals that are used in silicon substrates today. However, the initially simple Al-to-Si contact structure has evolved into a variety of more complex structures for the purposes of creating barriers to the diffusion of one material into another, or for reducing the contact resistance between contacting materials. Some materials used for both purposes include titanium (Ti), titanium-tungsten (Ti:W), chemical vapor deposited tungsten (CVD W), and polycrystalline silicon (polySi), thus forming the structures Al—Ti—Si, Al—Ti:W—Si, Al-CVD W—Si and Al-polySi—Si, respectively. Even more complex multilayered structures are used as discussed in S. Wolf, "Silicon Processing for the VLSI Era," vol.2, Lattice Press, Sunset Beach, Calif., 1990. where platinum-silicide (PtSi) and titanium-nitride (TiN), for example, are sandwiched to form Al—Ti:W—PtSi—Si and Al—TiN—Ti—Si contact metallurgies. The methods by which these structures are processed (e.g., sputtering, evaporating, etc.,) are well known in the art and as they are not significant to the invention, will not be described in detail here.

In contrast with the electrical resistance of metal-to-Si contacts, the resistance of metal-to-metal contacts in vias is smaller by about one to two orders of magnitude. For example, the specific resistivity of Al-to-Al contacts is approximately $10^8$ $\Omega$-cm$^2$ (See S. Wolf, "Silicon Processing for the VLSI Era," vol.2, Lattice Press, Sunset Beach, Calif., 1990, p.263.) It should be noted that the resistance of a contact area is obtained by dividing the resistivity by the area. Thus, the larger the area, the smaller is the contact resistance. However, it will be appreciated that with the advent of ultra large scale integration (ULSI) of semiconductors, and the concomitant scaling down of feature sizes including the holes, even the via contact resistances are becoming significant, and therefore methods for reducing them the more important. The magnitude of the electrical resistance becomes much larger when tungsten is used as the via plug connecting the aluminum metal layers. This is believed to be caused by fluorine (from the silane reduction of tungsten in $WF_6$) reacting with aluminum to form a nonvolatile aluminum-trifluoride ($AlF_3$) layer at the Al—W interface. In his book mentioned above, S. Wolf reports procedures for obtaining lower contact resistance values between selective CVD W and Al. Most of the reports cite the temperature and deposition rate dependency of the resulting contact resistivities and hence the resistances. Another approach involves the capping of the Al film with a layer of sputtered Ti:W during the same pumpdown as the Al deposition. Following the oxide deposition and the subsequent opening of the via holes, CVD W is selectively deposited on the Ti:W. Since no Al is exposed, the possibility of forming the highly resistive $AlF_3$ is avoided (D. Alugbin et al., "Low Contact Resistance of Selective CVD W over Ti:W-capped Al," *Proceedings 6th Conf. on CVD W, Cu, and Other Advanced Metals for ULSI and VLSI*, Materials Research Society, 1990)

In the present invention, the contact resistance in the via is further reduced by using aluminum-copper (AlCu) as the interconnect metal throughout. (Copper is added to alleviate the problems of electromigration and hillock formations, and the alloy is sputtered rather than evaporated for better control of the alloy composition, which are not described here). The use of AlCu as interconnect metal is well known in prior art. In step 50 of FIG. 3 of prior art, for example, upper metal-1 can be AlCu. After the said upper metal-1 in via hole is cleaned by a pre-sputter etch step 52 in the same FIG. 3, a thin film of titanium (Ti) is deposited by conventional means (step 54) followed by upper metal-2 deposition in step 56 of the same Figure. However, it is found in practice of manufacturing that titanium readily reacts with Al to form $TiAl_3$, which in turn causes high contact resistance in the via hole. That is, the prior art practice as described hereto results in unacceptably high via contact resistances in the recently advanced submicron technologies unless the steps of 54 and 56 are intervened by another process step. This other process is disclosed in the present invention as step 65 in FIG. 4, and is designated as "post-treatment" in the same Figure. The other steps of 60, 62, 64, 66 and 68 of FIG. 4 are analogous to steps 50, 52, 54, 56 and 58 of FIG. 3, where in the last step 58 or 68, titanium nitride (TiN) is deposited as an anti-reflective coating (ARC) by the well-known techniques of prior art. Thus, the key step 65 of this invention, namely the post-treatment step which is fully disclosed in the following sections, is performed in between steps 64 and 66 of FIG. 4.

SUMMARY OF THE INVENTION

It is therefore an object of this invention to provide a method for reducing the electrical resistance of contacting surfaces in via holes in semiconductor substrates.

It is a further object of this invention to formulate a post-treatment process for the purpose of reducing contact resistances.

It is still another object of this invention to formulate still another post-treatment process for the purpose of reducing contact resistances.

These objectives are accomplished by first forming via holes in the oxide that covers the first level metal on a substrate. The metal exposed in the holes is then pre-sputter-clean etched. Titanium is next sputter deposited into the holes. Prior to the deposition of the second level of metal, a nitrogen treatment step is introduced. This step is accomplished at room temperature. As a still another method, a vacuum break is performed in conjunction with the said nitrogen treatment of the surfaces in the via holes. After the completion of the post-treatment process, AlCu is sputter deposited into the holes followed by the deposition of an anti-reflective coating to facilitate the subsequent photo-lithographic processes as conventionally practiced in the manufacturing of semiconductor substrates.

BRIEF DESCRIPTION OF THE DRAWINGS

FIG. 1. is a cross-section of a prior art semiconductor substrate showing two levels of metal interconnections.

FIG. 2. is a cross-section of a via plug connecting first and second level of metals.

FIG. 3. is a process flow for prior art metal deposition.

FIG. 4. is a process flow showing a post-treatment step in metal deposition.

FIG. 5(a). is a plot of prior art via contact resistance.

DESCRIPTION OF THE PREFERRED EMBODIMENTS

Figure 5B:
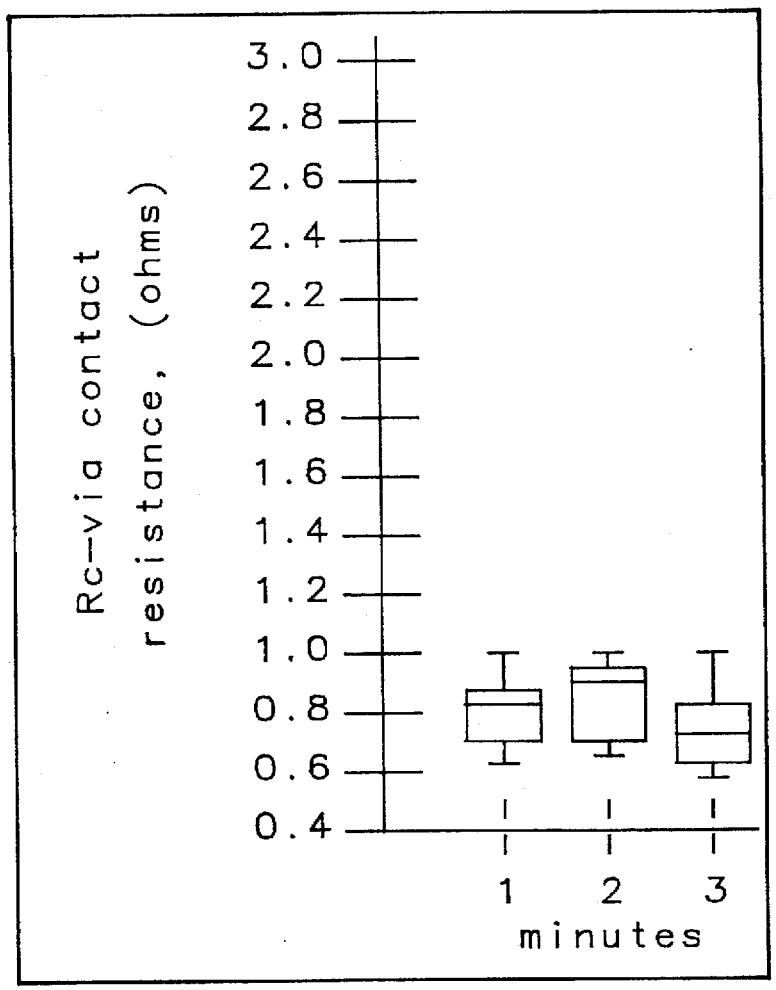
FIG. 5(b). is a plot of via contact resistance as a function of time of post-treatment with nitrogen.

Referring now to FIG. 1 of prior art, a cross-section of a MOS silicon substrate (10) is shown where region 12 is the gate, region 14, the channel under the gate, and 16 is the source or drain. These regions are formed by methods well known in the art and as they are not significant to the invention, will not be described in detail here. It is sufficient to note that the substrate in FIG. 1 has been subjected to many different process steps including field isolation, gate definition, source/drain implants. Regions 40 and 42 are the first and second interlevel dielectrics, respectively, that are formed as insulators between metal layers 24 and 34. Regions 22 and 32 are the metal plugs that perform the function of connecting one conductor layer with another, and are called, respectively, "contact-plug" and "via-plug." Region 20 under the contact-plug is the metal-to-silicon contact surface, and region 30 under the via-plug is the metal-to-metal contact surface. FIG. 2 is an enlarged view of the via plug (32) connecting upper metal-1 (24) to upper metal-2 (34) with an intervening layer of titanium (35). Upper metal-1 is covered with titanium-nitride (25) as an anti-reflective coating, which is not shown for the second level upper metal-2.

Figure 5C:
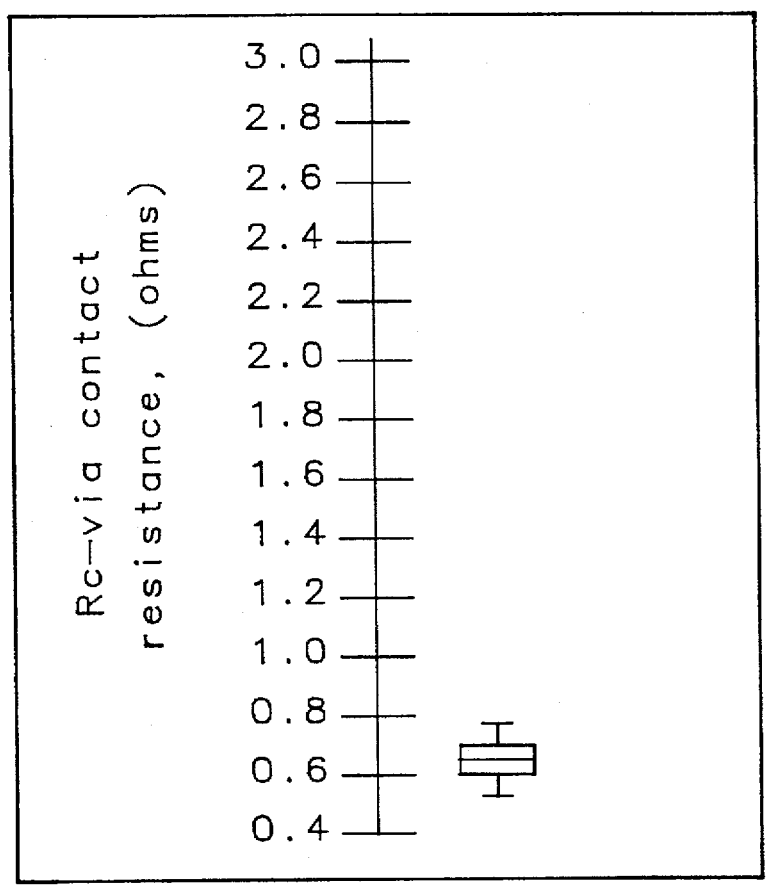
FIG. 5(c). is a plot of via contact resistance after post-treatment with vacuum break in nitrogen.

In the present invention, both upper metal-1 and upper metal-2 are AlCu. Subsequent to the opening of the via holes, the exposed AlCu in the via hole is clean etched and then capped with sputtered titanium as indicated in both FIGS. 3 and 4. In the prior art of FIG. 3, the next step is to sputter deposit Al—Cu in situ, that is without a vacuum break. This process yields a metal-to-metal electrical resistivity, which, for the sub-micron via sizes considered here, corresponds to the measured contact resistance, $R_{cm}$, shown in FIG. 5(a) of prior art. In the present invention, Al—Cu is likewise deposited in situ, however, after the introduction of nitrogen treatment at room temperature. The contact resistance, $R_{cm}$, of the vias obtained after the completion of this key process step is plotted in FIG. 5(b). Clearly, the mean resistance (0.8 Ω) is nearly one-half that of the contact resistance of the vias not subjected to the nitrogen treatment (1.4 Ω) shown in FIG. 5(a). Also, the standard deviation, 0.1 Ω is much tighter in comparison with 0.7 Ω of the untreated vias. It will be noted in FIG. 5(b) that the mean and standard deviation of the contact resistance is still lower when the exposure to nitrogen is increased to three minutes. An alternative method is also disclosed in this invention where the nitrogen treatment is performed after the vacuum break prior to the AlCu deposition. In this case the mean contact resistance is even lower, i.e., 0.7 Ω as seen in FIG. 5(c). In either method, the introduction of nitrogen or air right after Ti deposition is found to inhibit the reaction of Ti with Al to form $TiAl_3$, thereby preventing the formation of high contact resistance in the via hole. After the completion of these key steps, the next level metal, AlCu, is sputter deposited followed by the formation of titanium nitride (TiN) film as the anti-reflective coating (ARC) to facilitate the subsequent lithographic processes (FIG. 4).

Thus, it is seen in the present invention of FIG. 4 that the conventional method of forming via plugs in the prior art as shown in FIG. 3 is modified with the introduction of a post-treatment step(65) in between the steps of sputter depositing titanium and aluminum-copper. This key step is performed in a nitrogen ($N_2$) environment and without a vacuum break, as indicated in FIG. 4. The preferred parameters for the nitrogen environment are:

TABLE I

| Parameters: | $N_2$ Environment in chamber |
|---|---|
| System temperature | room-30° C. |
| System pressure (mT) | 5–15 |
| Environment (sccm) | 100–300 |
| Time (sec) | 60–180 | where the system pressure is given in millitorr, the nitrogen environment in standard cubic centimeters, and the time in seconds.

An alternative method disclosed in this invention is to perform the nitrogen treatment after a vacuum break prior to the AlCu deposition. In still another embodiment, nitrogen treatment is performed first, followed by vacuum break prior to the AlCu deposition. With either of these two approaches, the titanium layer is exposed to atmospheric pressure and room temperature as a result of the vacuum break. After the completion of these key steps, the next level metal, AlCu, is sputter deposited followed by the formation of titanium nitride (TiN) film as the anti-reflective coating (ARC) to facilitate the subsequent lithographic processes. The preferred thickness of the various layers in Angstroms (Å) are as follows:

TABLE II

| Layer: | Thickness (Å) |
|---|---|
| Titanium | 1000–2000 |
| Aluminum-copper | 5500–6500 |
| Titanium-nitride | 200–300 |

In the description above, the various details were set forth, such as specific materials, process parameters, etc., in order to provide an understanding of the present invention. It will be obvious, however, to those skilled in the art that these specific details need not be employed to practice the present invention. For example, the length of time of the nitrogen treatment may be varied as a trade off between throughput and the desired contact resistances. Similarly, the vacuum break may be traded off with nitrogen That is to say that, while the invention has been particularly shown and described with reference to the preferred embodiments thereof, it will be understood by those skilled in the art that various changes in form and details may be made without departing from the spirit and scope of the invention. For instance, the same procedures described here for MOS fabrication are just as applicable to the fabrication of bipolar semiconductors.

What is claimed is:

1. A method of post-treatment in a via metal deposition process on a semiconductor substrate comprising the steps of:

providing a silicon substrate over which via holes are formed through an insulating layer onto a first upper metal layer;

performing a pre-sputter-clean etch of said via holes;

sputter depositing in vacuum a barrier layer in said via holes;

performing said post-treatment of said barrier layer in nitrogen gas followed by a vacuum break whereby said barrier layer is exposed to atmospheric pressure;

depositing second upper metal layer over said barrier layer; and depositing an anti-reflective coating (ARC) onto said second upper metal layer.

2. The method of claim 1, wherein the first upper metal layer is aluminum copper alloy.

3. The method of claim 1, wherein the insulating layer is planarized oxide.

4. The method of claim 1, wherein said insulating layer is dry-etched to form via holes.

5. The method of claim 1, wherein said pre-sputter-clean etch is performed with an etchant aided by argon ions.

6. The method of claim 1, wherein said barrier layer is titanium (Ti).

7. The method of claim 6, wherein the Ti thickness is in between about 1,000 to 2,000 Angstroms.

8. The method of claim 1, wherein said post-treatment temperature is performed between about 20° C. to 30° C. at atmospheric conditions.

9. The method of claim 1, wherein said vacuum break to atmospheric pressure is performed air at a temperature in between about 20° C. to 30° C. at atmospheric conditions.

10. The method of claim 1, wherein the second upper metal layer is aluminum copper alloy.

11. The method of claim 10, wherein the aluminum copper alloy thickness is in between about 5,500 to 6,500 Angstroms.

12. The method of claim 9, wherein said ARC is titanium nitride (TiN).

13. The method of claim 12, wherein said TiN thickness is between about 200 to 300 Angstroms.

* * * * *